US012676289B2

(12) United States Patent
Chua et al.

(10) Patent No.: US 12,676,289 B2
(45) Date of Patent: Jul. 7, 2026

(54) MONOLITHIC MODULAR HIGH-FREQUENCY PLASMA SOURCE

(71) Applicant: Applied Materials, Inc., Santa Clara, CA (US)

(72) Inventors: Thai Cheng Chua, Cupertino, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 887 days.

(21) Appl. No.: 17/960,535

(22) Filed: Oct. 5, 2022

(65) Prior Publication Data

US 2023/0026546 A1      Jan. 26, 2023

Related U.S. Application Data

(62) Division of application No. 16/586,462, filed on Sep. 27, 2019, now abandoned.

(51) Int. Cl.
| | |
|---|---|
| *H01L 21/306* | (2006.01) |
| *H01J 37/32* | (2006.01) |
| *H05H 1/46* | (2006.01) |

(52) U.S. Cl.
CPC ......... *H01J 37/3211* (2013.01); *H01J 37/321* (2013.01); *H01J 37/32119* (2013.01); *H01J 37/32238* (2013.01); *H05H 1/4652* (2021.05); *H01J 2237/332* (2013.01); *H01J 2237/3321* (2013.01)

(58) Field of Classification Search
CPC ................. H01J 37/321; H01J 37/3211; H01J 37/32119; H01J 37/32431; H01J 37/3222; H01J 37/32229; H01J 37/32238; H01J 37/32247; H05H 1/4652; H05H 1/4645; H05H 1/466; H05H 1/463; H05H 1/461;
(Continued)

(56) References Cited

U.S. PATENT DOCUMENTS 5,683,548 A * 11/1997 Hartig ................. H01J 37/3244
                                                             438/711
5,910,221 A      6/1999  Wu
(Continued)

FOREIGN PATENT DOCUMENTS

| | | |
|---|---|---|
| CN | 101595768 A | 12/2009 |
| CN | 103956315 A | 7/2014 |

(Continued)

OTHER PUBLICATIONS

Notice of Reasons for Rejection from Japanese Patent Application No. 2022-518721 dated Mar. 31, 2023, 8 pgs.
(Continued)

*Primary Examiner* — Luz L Alejandro Mulero
(74) *Attorney, Agent, or Firm* — Schwabe, Williamson & Wyatt, P.C.

(57) ABSTRACT

Embodiments disclosed herein include a monolithic source array. In an embodiment, the monolithic source array comprises a dielectric plate having a first surface and a second surface opposite from the first surface. The monolithic source array may further comprise a plurality of protrusions that extend out from the first surface of the dielectric plate, wherein the plurality of protrusions and the dielectric plate are a monolithic structure.

9 Claims, 9 Drawing Sheets

(58) Field of Classification Search

CPC ... H05H 1/4622; H05H 1/2406; H05H 1/2418

See application file for complete search history.

(56) References Cited

U.S. PATENT DOCUMENTS

| | | | | |
|---|---|---|---|---|
| 6,269,765 | B1 | 8/2001 | Chu et al. | |
| 2001/0042594 | A1 | 11/2001 | Shamouilian et al. | |
| 2002/0069827 | A1* | 6/2002 | Sakamoto | C23C 16/482 |
| 2009/0278459 | A1* | 11/2009 | Vinogradov | H01J 37/321 |
| | | | | 315/111.51 |
| 2010/0095889 | A1* | 4/2010 | Kai | H10P 32/1204 |
| | | | | 118/663 |
| 2011/0226421 | A1* | 9/2011 | Hayashi | H01J 37/32091 |
| | | | | 156/345.43 |
| 2015/0287572 | A1 | 10/2015 | Daugherty et al. | |
| 2017/0263421 | A1 | 9/2017 | Ikeda et al. | |
| 2018/0294143 | A1 | 10/2018 | Chua et al. | |
| 2018/0323043 | A1* | 11/2018 | Kraus | H01J 37/32238 |

FOREIGN PATENT DOCUMENTS

| | | | |
|---|---|---|---|
| CN | 106816353 | B | 8/2018 |
| JP | 20020100623 | | 4/2002 |
| JP | 2011192912 | A | 9/2011 |
| JP | 2013191593 | A | 9/2013 |
| JP | 2017028242 | A | 2/2017 |
| JP | 2017168186 | A | 9/2017 |
| JP | 20200520536 | | 7/2020 |
| MX | 9700586 | A | 8/1997 |
| TW | 200917910 | A | 4/2009 |
| TW | 201508809 | A | 3/2015 |
| TW | 201844064 | A | 12/2018 |
| TW | 201901734 | A | 1/2019 |
| WO | 2004032176 | A1 | 4/2004 |
| WO | 2008099896 | A1 | 5/2010 |
| WO | 2014010317 | A1 | 1/2014 |
| WO | 2018208392 | A1 | 11/2018 |

OTHER PUBLICATIONS

Official Letter from Taiwan Patent Application No. 112137610 dated Jun. 24, 2024, 5 pgs.

Extended Search Report from European Patent Application No. 20869825.8 dated Aug. 21, 2023, 8 pgs.

International Search Report and Written Opinion from PCT/US2020/050900 mailed Dec. 24, 2020, 9 pgs.

Non-Final Office Action from U.S. Appl. No. 16/586,462 dated Dec. 24, 2021, 16 pgs.

International Preliminary Report on Patentability from PCT/US2020/050900 mailed Apr. 7, 2022, 6 pgs.

Final Office Action from U.S. Appl. No. 16/586,462 dated Jul. 5, 2022, 21 pgs.

Preliminary Rejection from Korean Patent Application No. 10-2022-7013849 dated Sep. 25, 2024, 7 pgs.

Official Letter from Taiwan Patent Application No. 109132662 dated Dec. 5, 2022, 11 pgs.

Notice of First Office Action from Chinese Patent Application No. 202080065164.6 dated Jul. 6, 2023, 17 pgs.

Official Letter from Taiwan Patent Application No. 109132662 dated Aug. 2, 2023, 7 pgs.

Notice to File a Response from Korean Patent Application No. 10-2025-7027859 dated Feb. 19, 2026, 6 pgs.

* cited by examiner

MONOLITHIC MODULAR HIGH-FREQUENCY PLASMA SOURCE

CROSS-REFERENCE TO RELATED APPLICATIONS

This application is a Divisional of U.S. patent application Ser. No. 16/586,462, filed on Sep. 27, 2019, the entire contents of which are hereby incorporated by reference herein.

BACKGROUND

1) Field

Embodiments relate to the field of semiconductor manufacturing and, in particular, to monolithic source arrays for high-frequency plasma sources.

2) Description of Related Art

Some high-frequency plasma sources include applicators that pass through an opening in a dielectric plate. The opening through the dielectric plate allows for the applicator (e.g., a dielectric cavity resonator) to be exposed to the plasma environment. However, it has been shown that plasma is also generated in the opening in the dielectric plate in the space surrounding the applicator. This has the potential of generating plasma non-uniformities within the processing chamber. Furthermore, exposing the applicator to the plasma environment may lead to a more rapid degradation of the applicator.

In some embodiments, the applicators are positioned over the dielectric plate or within a cavity into (but not through) the dielectric plate. Such configurations have reduced coupling with the interior of the chamber and, therefore, does not provide an optimum plasma generation. The coupling of the high-frequency electromagnetic radiation with the interior of the chamber is diminished in part due to the additional interface between the dielectric plate and the applicator across which the high-frequency electromagnetic radiation needs to propagate. Additionally, variations of the interface (e.g., positioning of the applicator, surface roughness of the applicator and/or the dielectric plate, angle of the applicator relative to the dielectric plate, etc.) at each applicator and across different processing tools may result in plasma non-uniformities.

Particularly, when the applicators are discrete components from the dielectric plate, plasma non-uniformity (within a single processing chamber and/or across different processing chambers (e.g., chamber matching)) is more likely to occur. For example, with discrete components, small variations (e.g., variations in assembly, machining tolerances, etc.) can result in plasma non-uniformities that negatively affect processing conditions within the chamber.

SUMMARY

Embodiments disclosed herein include a monolithic source array. In an embodiment, the monolithic source array comprises a dielectric plate having a first surface and a second surface opposite from the first surface. The monolithic source array may further comprise a plurality of protrusions that extend out from the first surface of the dielectric plate, wherein the plurality of protrusions and the dielectric plate are a monolithic structure.

Additional embodiments may include an assembly for a processing tool. In an embodiment, the assembly comprises a monolithic source array and a housing. In an embodiment, the monolithic source array comprises a dielectric plate and a plurality of protrusions extending up from a surface of the dielectric plate. In an embodiment, the housing comprises a plurality of openings sized to receive each of the protrusions.

An additional embodiment disclosed herein comprises a processing tool. In an embodiment, the processing tool comprises a chamber and an assembly interfacing with the chamber. In an embodiment, the assembly comprises a monolithic source array and a housing. In an embodiment, the monolithic source array comprises a dielectric plate having a first surface and a second surface opposite from the first surface. In an embodiment, the second surface is exposed to an interior volume of the chamber, and the second surface is exposed to an exterior environment. The monolithic source array may further comprise a plurality of protrusions that extend out from the first surface of the dielectric plate. In an embodiment, the plurality of protrusions and the dielectric plate are a monolithic structure. In an embodiment, the housing comprises a conductive body and a plurality of openings through the conductive body. In an embodiment, each opening is sized to surround one of the protrusions.

DETAILED DESCRIPTION

Systems described herein include monolithic source arrays for high-frequency plasma sources. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, high-frequency plasma sources with discrete applicators may result in plasma non-uniformities within a chamber and in non-optimum injection of the high-frequency electromagnetic radiation into the chamber. The non-uniformities in the plasma may arise for different reasons, such as assembly issues, manufacturing tolerances, degradation, and the like. The non-optimum injection of the high-frequency electromagnetic radiation into the chamber may result (in part) from the interface between the applicator and the dielectric plate.

Accordingly, embodiments disclosed herein include a monolithic source array. In an embodiment, the monolithic source array comprises a dielectric plate and a plurality of protrusions that extend up from a surface of the dielectric plate. Particularly, the protrusions and the dielectric plate form a monolithic part. That is, the protrusions and the dielectric plate are fabricated from a single block of material. The protrusions have dimensions suitable for being used as the applicators. For example, holes into the protrusions may be fabricated that accommodate a monopole antenna. The protrusions may, therefore, function as a dielectric cavity resonator.

Implementing the source array as a monolithic part has several advantages. One benefit is that tight machining tolerances may be maintained in order to provide a high degree of uniformity between parts. Whereas discrete applicators need assembly, the monolithic source array avoids possible assembly variations. Additionally, the use of a monolithic source array provides improved injection of high-frequency electromagnetic radiation into the chamber, because there is no longer a physical interface between the applicator and the dielectric plate.

Monolithic source arrays also provide improved plasma uniformity in the chamber. Particularly, the surface of the dielectric plate that is exposed to the plasma does not include any gaps to accommodate the applicators. Furthermore, the lack of a physical interface between the protrusions and the dielectric plate improves lateral electric field spreading in the dielectric plate.

Figure 1:
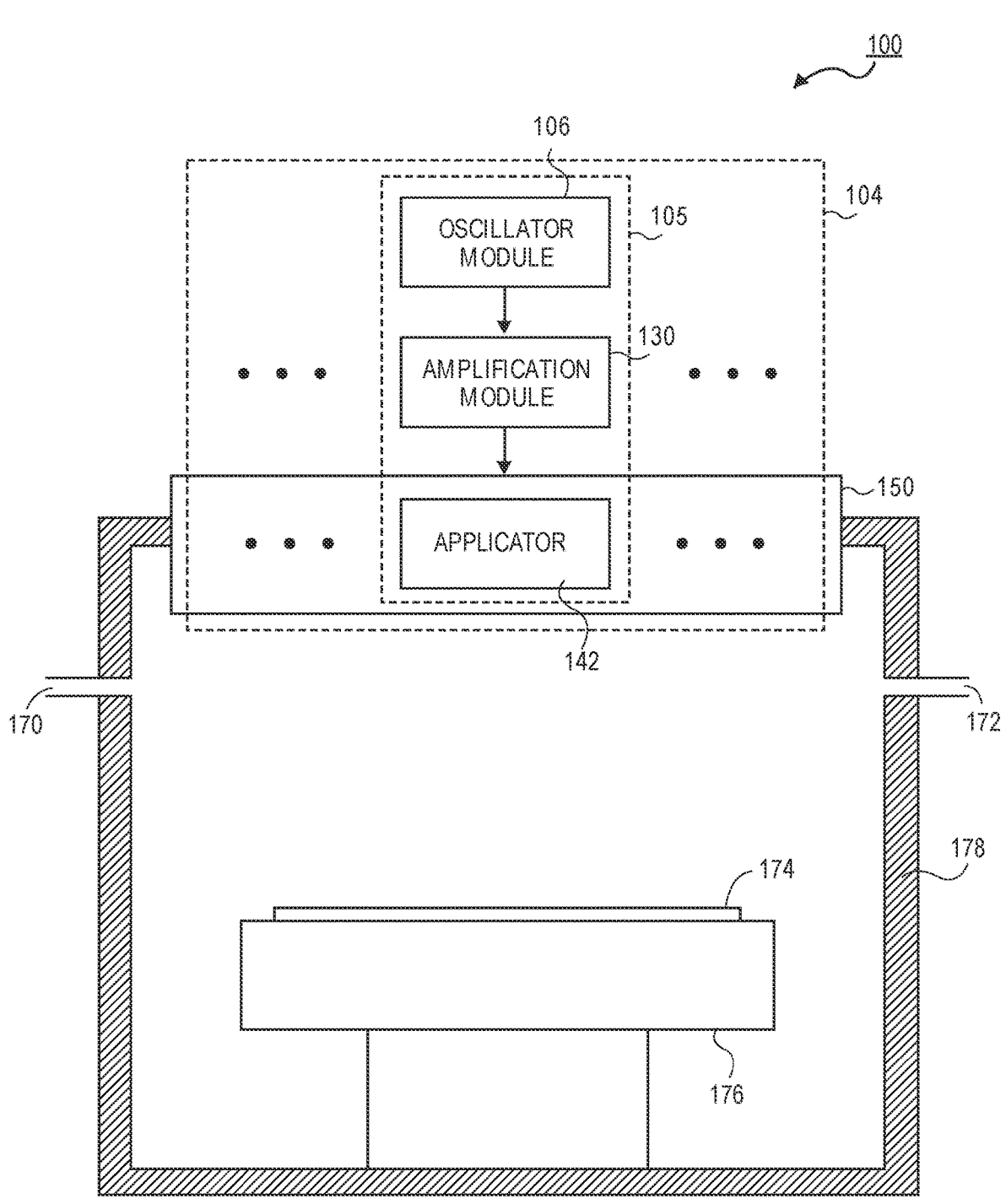
FIG. 1 is a schematic illustration of a processing tool that comprises a modular high-frequency emission source with a monolithic source array that comprises a plurality of applicators, in accordance with an embodiment.

Referring now to FIG. 1, a cross-sectional illustration of a plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning. Additional embodiments may include a processing tool 100 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that gas may also be injected into the chamber 178 through a monolithic source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the monolithic source array 150. However, it is to be appreciated that the monolithic source array 150 may be a monolithic structure that comprises one or more portions of the applicator 142 (e.g., a dielectric resonating body) and a dielectric plate that faces the interior of the chamber 178.

In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the processing gasses in the chamber 178 to produce a plasma.

Figure 2:
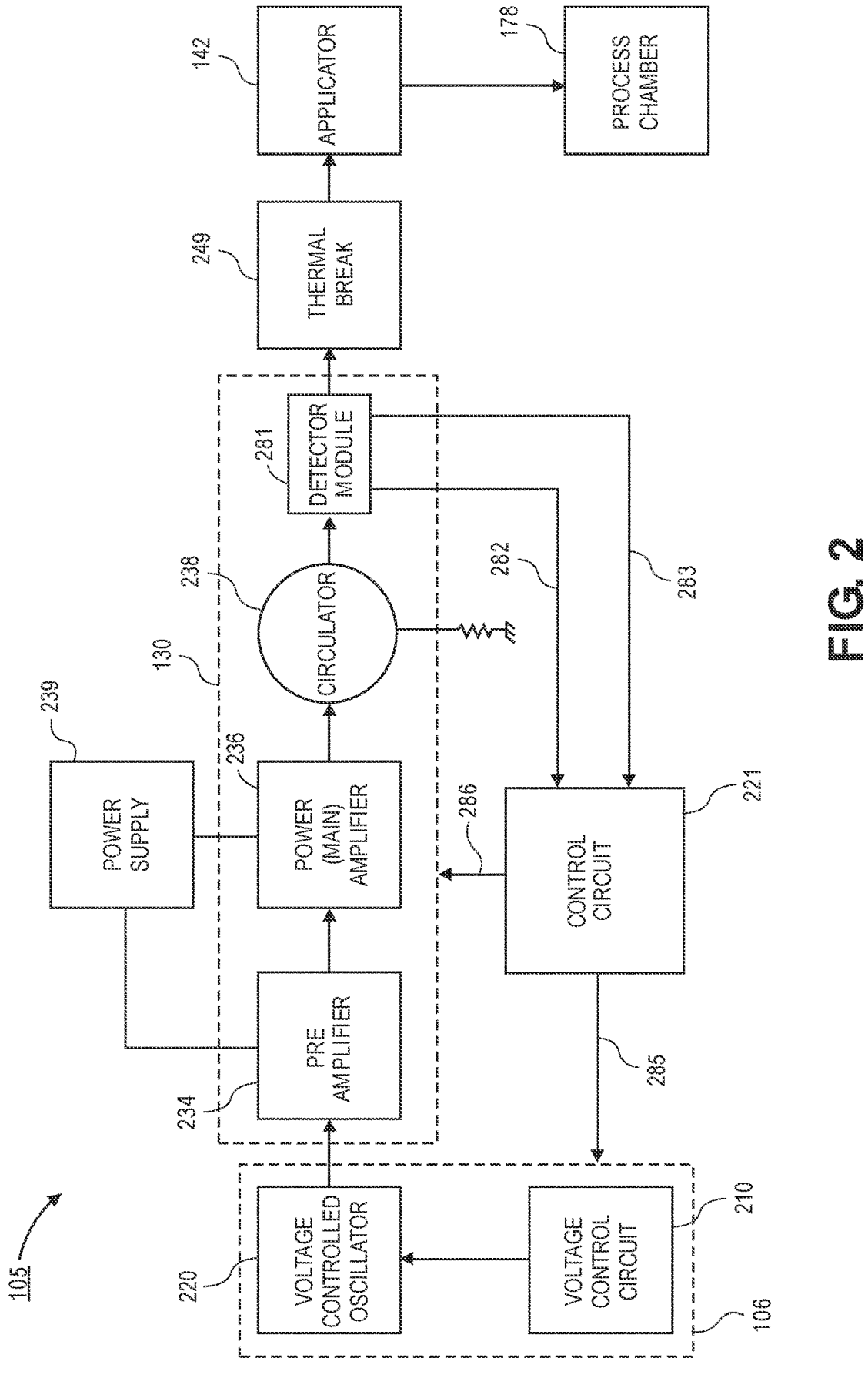
FIG. 2 is a block diagram of a modular high-frequency emission module, in accordance with an embodiment.

Referring now to FIG. 2, a schematic of a solid state high-frequency emission module 105 is shown, in accordance with an embodiment. In an embodiment, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system (e.g., between the circulator 238 and the thermal break 249). In an embodiment, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In an embodiment, control signal 285 adjusts the oscillator module 106 to optimize the high-frequency radiation coupled to the amplification module 130. In an embodiment, control signal 286 adjusts the amplification module 130 to optimize the output power coupled to the applicator 142 through the thermal break 249. In an embodiment, the feedback control of the oscillator module 106 and the amplification module 130, in addition to the tailoring of the impedance matching in the thermal break 249 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3A:
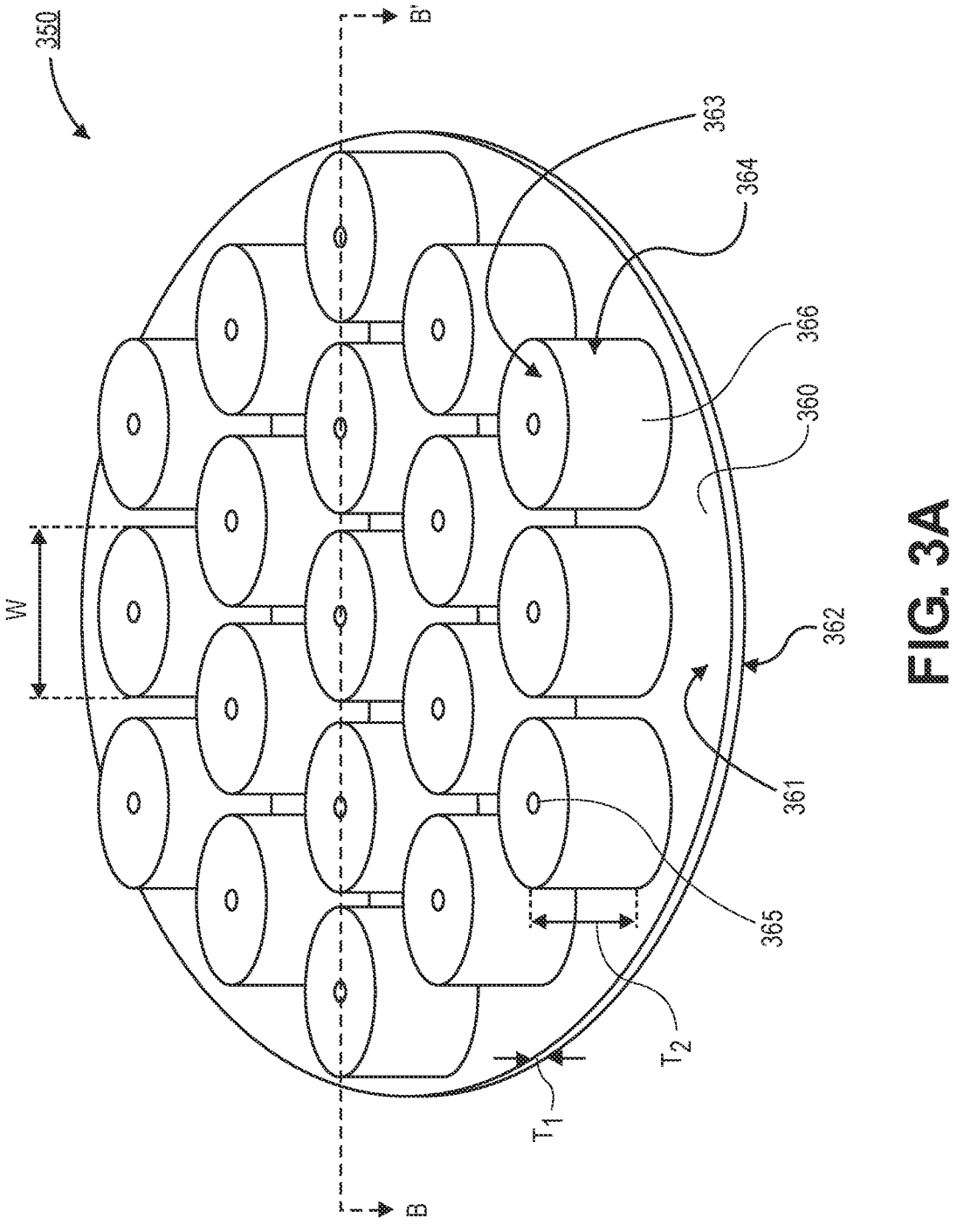
FIG. 3A is a perspective view illustration of a monolithic source array that comprises a plurality of applicators and a dielectric plate, in accordance with an embodiment.

Referring now to FIG. 3A, a perspective view illustration of a monolithic source array 350 is shown, in accordance with an embodiment. In an embodiment, the monolithic source array 350 comprises a dielectric plate 360 and a plurality of protrusions 366 that extend up from the dielectric plate 360. In an embodiment, the dielectric plate 360 and the plurality of protrusions 366 are a monolithic structure. That is, there is no physical interface between a bottom of the protrusions 366 and a first surface 361 of the dielectric plate 360. As used herein, a "physical interface" refers to a first surface of a first discrete body contacting a second surface of a second discrete body.

Each of the protrusions 366 are a portion of the applicator 142 used to inject high-frequency electromagnetic radiation into a processing chamber 178. Particularly, the protrusions 366 function as the resonating body of the applicator 142. Other components of the applicator 142 (e.g., the monopole antenna and the grounded housing surrounding the resonating body) may be discrete components from the monolithic source array 350 and are described in greater detail below.

The dielectric plate 360 comprises a first surface 361 and a second surface 362 opposite from the first surface 361. The dielectric plate has a first thickness $T_1$ between the first surface 361 and the second surface 362. In an embodiment, the first thickness $T_1$ is less than approximately 30 mm, less than approximately 20 mm, less than approximately 10 mm, or less than approximately 5 mm. In a particular embodiment, the first thickness $T_1$ is approximately 3 mm. Decreasing the first thickness $T_1$ provides improved coupling of high-frequency electromagnetic radiation into the processing chamber. However, increases to the first thickness $T_1$ may provide improved mechanical support and decreases the probability of a mechanical failure (e.g., the dielectric plate 360 cracking). In the illustrated embodiment, the dielectric plate 360 is shown with a substantially circular shape. However, it is to be appreciated that the dielectric plate 360 may have any desired shape (e.g., polygonal, elliptical, wedge shaped, or the like).

The plurality of protrusions 366 extend up from the first surface 361 of the dielectric plate 360. For example, sidewalls 364 are oriented substantially perpendicular to the first surface 361 of the dielectric plate 360. The protrusions 366 further comprise a third surface 363. The third surface 363 may be substantially parallel to the first surface 361. In an embodiment, a hole 365 is disposed into the third surface 363 of each protrusion. The hole 365 is sized to accommodate a monopole antenna of the applicator 142. In an embodiment, the hole 365 is positioned at the axial center of the protrusion 366.

In an embodiment, the protrusions 366 may have a second thickness $T_2$ between the first surface 361 and the third surface 363. In an embodiment, the second thickness $T_2$ may be chosen to provide a resonating body for the applicator. For example, the dimensions of the protrusions 366 may depend on at least the material of the monolithic source array, the thickness of the dielectric plate 360, the desired operating frequency, among other considerations. Embodiments may generally include decreasing the second thickness $T_2$ of the protrusion as the first thickness $T_1$ of the dielectric plate increases In an embodiment, the plurality of protrusions 366 are arranged in an array. In the illustrated embodiment, the plurality of protrusions 366 are arranged in a close-packed array, though other packing arrangements are possible. Furthermore, while nineteen protrusions 366 are shown, it is to be appreciated that embodiments may include one or more protrusions 366 extending away from the first surface 361 of the dielectric plate 360. In the illustrated embodiment, each of the protrusions 366 have the same dimensions (e.g., thickness $T_2$ and width W). In other embodiments, the dimensions of the protrusions 366 may be non-uniform.

In an embodiment, the monolithic source array 350 comprises a dielectric material. For example, the monolithic source array 350 may be a ceramic material. In an embodiment, one suitable ceramic material that may be used for the monolithic source array 350 is $Al_2O_3$. The monolithic structure may be fabricated from a single block of material. In other embodiments, a rough shape of the monolithic source array 350 may be formed with a molding process, and subsequently machined to provide the final structure with the desired dimensions. For example, green state machining and firing may be used to provide the desired shape of the monolithic source array 350.

Figures 3B, 3C, 3D:
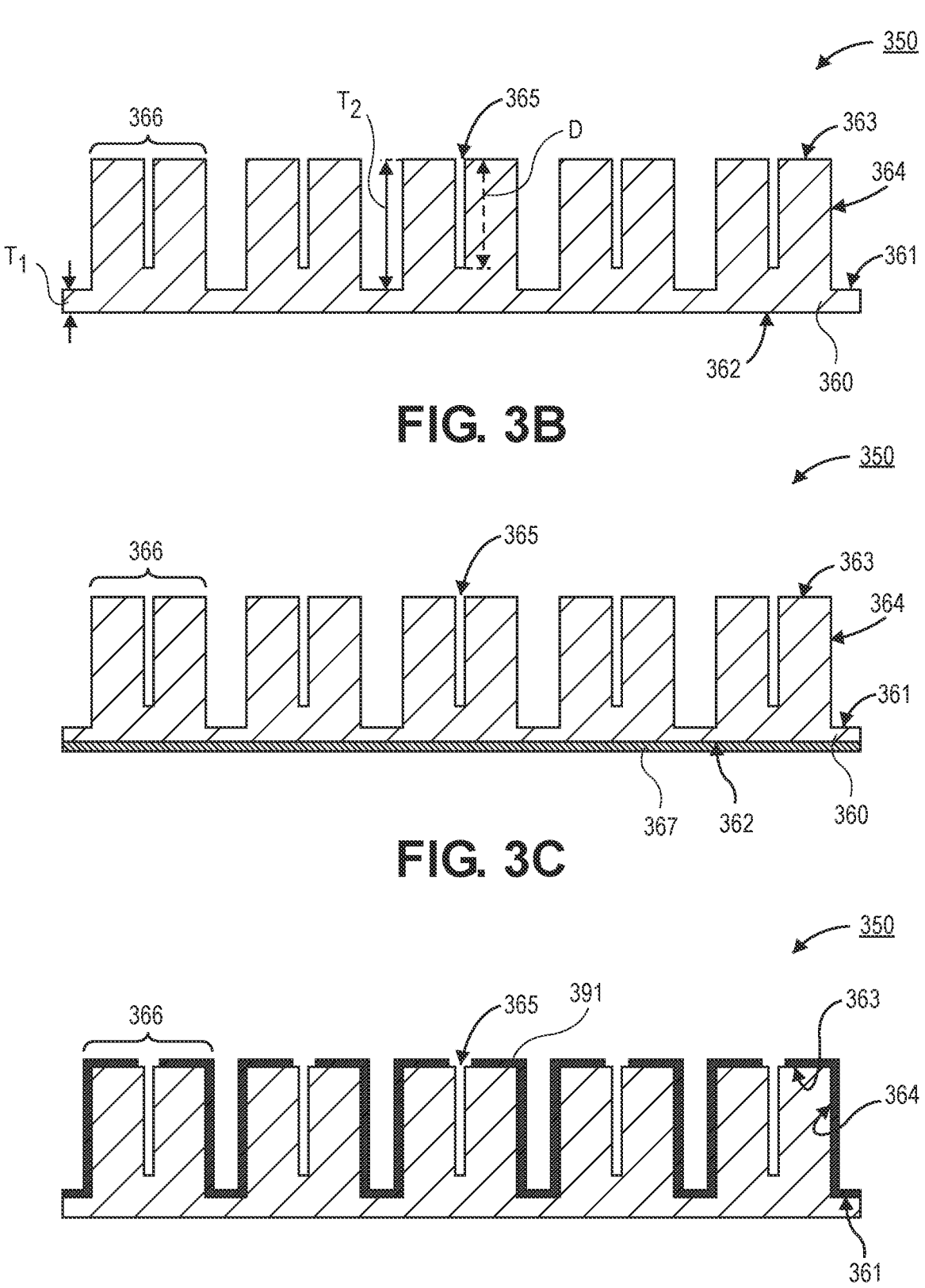
FIG. 3B is a cross-sectional illustration of the monolithic source array in FIG. 3A along line B-B', in accordance with an embodiment.
FIG. 3C is a cross-sectional illustration of the monolithic source array with a passivation layer over a surface of the dielectric plate, in accordance with an embodiment.
FIG. 3D is a cross-sectional illustration of the monolithic source array with a conductive layer over one or more surfaces, in accordance with an embodiment.
Figure 3E:
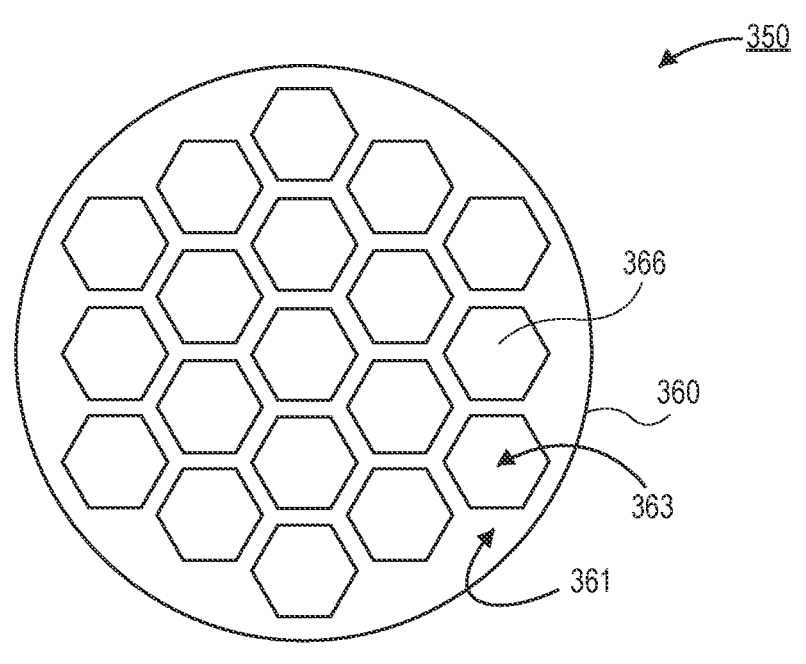
FIG. 3E is a plan view illustration of a monolithic source array with a plurality of applicators that are hexagonal in shape, in accordance with an embodiment.

Referring now to FIG. 3B, a cross-sectional illustration of the monolithic source array 350 in FIG. 3A along line B-B' is shown, in accordance with an embodiment. As shown, the sidewall surface 364 of the protrusions 366 intersects with the first surface 361 of the dielectric plate 360. That is, the bottom of protrusion 366 seamlessly transitions into the dielectric plate 360 without there being a physical interface between the protrusion 366 and the dielectric plate 360.

FIG. 3B more clearly illustrates the depth D of the holes 365 into the third surfaces 363 of the protrusions 366. As shown, the depth D of the holes 365 is less than the second thickness $T_2$ of the protrusions 366. In such embodiments, the holes 365 do not extend down into the dielectric plate 360 of the monolithic source array 350. In other embodiments, (e.g., for larger first thicknesses $T_1$) the holes 365 may have a depth D that is greater than the second thickness $T_2$ of the protrusions 366 and extend into the dielectric plate 360 of the monolithic source array 350.

Referring now to FIG. 3C, a cross-sectional illustration of a monolithic source array 350 is shown, in accordance with an additional embodiment. The monolithic source array 350 in FIG. 3C may be substantially similar to the monolithic source array 350 in FIG. 3B, with the exception that a dielectric layer 367 is disposed over one or more surfaces of the monolithic source array 350. In the illustrated embodiment, the dielectric layer 367 is disposed over the second surface 362 of the dielectric plate 360. However, a dielectric layer 367 may be disposed over any number of surfaces of the monolithic source array 350. For example, dielectric layers 367 may be disposed over the first surface 361, the third surfaces 363, the sidewall surfaces 364, or within the holes 365. In an embodiment, different dielectric layers 367 may be disposed over different surfaces. For example, a first dielectric layer 367 with a first composition may be disposed over the first surface 361, and a second dielectric layer 367 with a second composition may be disposed over the second surface 362.

In some embodiments, the dielectric layer 367 may be a chemically inert dielectric layer in order to provide protection to portions of the monolithic source array 350 that would otherwise be exposed to the chamber interior. For example, when left uncovered, portions of the second surface 362 may be exposed to a plasma environment and be more susceptible to erosion or other degradation. In an embodiment, a chemically inert dielectric layer 367 may comprise one or more of $Al_2O_3$, $SiO_2$, SiN, a transition metal oxide (e.g., $Y_2O_3$, $HfO_2$, or $La_2O_3$), a transition metal nitride, and combinations thereof. Such chemically inert dielectric layers 367 may further comprise fluorine (F). Embodiments may also include inert dielectric layers 367 that include compositions comprising groups of elements (e.g., aluminum-oxygen-nitrogen (Al—O—N), aluminum-hafnium-oxygen-fluorine (Al—Hf—O—F), yttrium-oxygen-fluorine-nitrogen (Y—O—F—N), or hafnium-zirconium-oxygen-fluorine-nitrogen (Hf—Zr—O—F—N)).

In an embodiment, inert dielectric layers 367 may be deposited over the monolithic source array 350 with any suitable deposition process. For example, the inert dielectric layers 367 may be applied using plasma spray coating, thermal spray coating, chemical vapor deposition (CVD), physical vapor deposition (PVD), sputtering, atomic layer deposition (ALD), or plasma-enhanced ALD (PE-ALD).

Referring now to FIG. 3D, a cross-sectional illustration of the monolithic source array 350 in FIG. 3A along line B-B' is shown, in accordance with an embodiment. The monolithic source array 350 in FIG. 3D may be substantially similar to the monolithic source array 350 in FIG. 3B, with the exception that a conductive layer 391 is disposed over one or more surfaces. For example, the conductive layer 391 may be disposed over one or more of the first surface 361, the third surface 363, and the sidewalls 364 of the protrusions 366. During operation, the conductive layer 391 may be grounded. In some embodiments, the third surface 363 may not be entirely covered by the conductive layer 391. For example, portions of the third surface 363 proximate to the holes 365 may be exposed to reduce the probability of arcing between the conductive layer 391 and the antenna (not shown) that is inserted into the hole 365. In an embodiment, the conductive layer 391 may be any suitable conductive layer (e.g., aluminum, titanium, etc.).

Referring now to FIG. 3D, a plan view illustration of a monolithic source array 350 is shown in accordance with an additional embodiment. The monolithic source array 350 is substantially similar to the monolithic source array 350 in FIG. 3A, with the exception that the protrusions 366 have a different cross section as viewed along a plane parallel to the first surface 361. In FIG. 3D, the outlines of the protrusions 366 are substantially hexagonal in shape, as opposed to being circular in FIG. 3A. While examples of circular and hexagonal cross-sections are shown, it is to be appreciated that the protrusions 366 may comprise many different cross-sections. For example, the cross-section of the protrusions 366 may have any shape that is centrally symmetric.

Figure 4A:
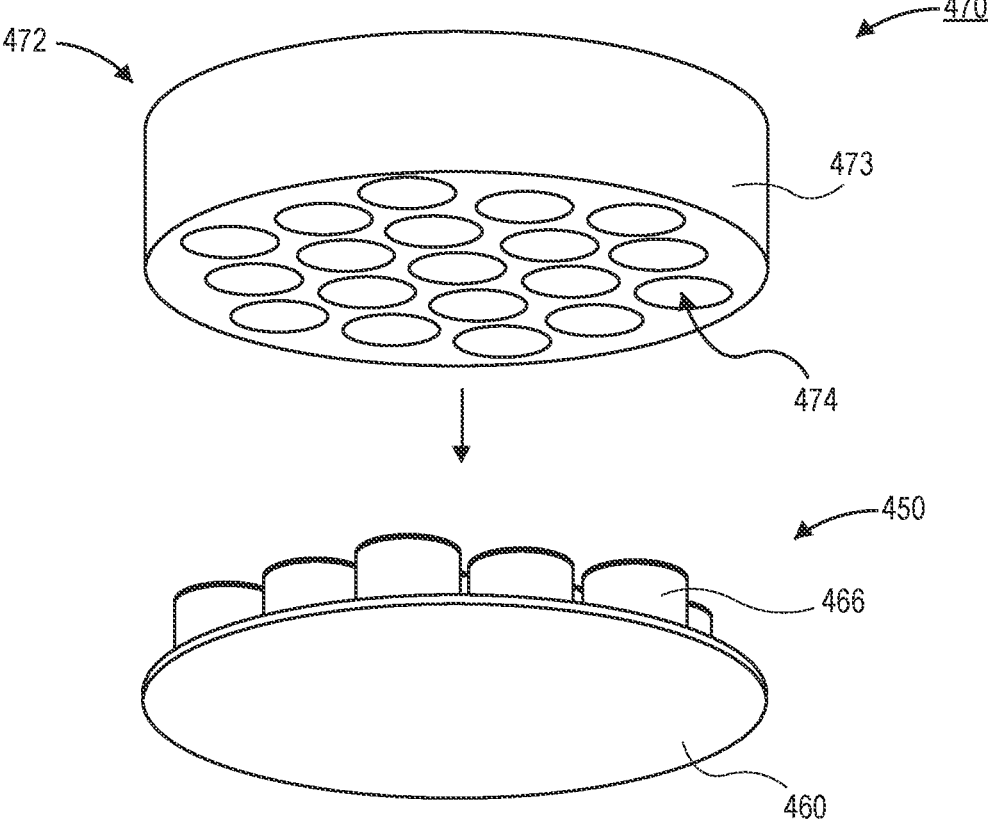
FIG. 4A is a perspective view illustration of a monolithic source array and a housing that interfaces with the monolithic source array to form an assembly, in accordance with an embodiment.

Referring now to FIG. 4A, an exploded view of an assembly 470 is shown, in accordance with an embodiment. In an embodiment, the assembly 470 comprises a monolithic source array 450 and a housing 472. The monolithic source array 450 may be substantially similar to the monolithic source arrays 350 described above. For example, the monolithic source array 450 may comprise a dielectric plate 460 and a plurality of protrusions 466 that extend up from the dielectric plate 460.

In an embodiment, the housing 472 comprises a conductive body 473. For example, the conductive body 473 may be aluminum or the like. The housing comprises a plurality of openings 474. The openings 474 may pass entirely through a thickness of the conductive body 473. The openings 474 may be sized to receive the protrusions 466. For example, as the housing 472 is displaced towards the monolithic source array 450 (as indicated by the arrow) the protrusions 466 will be inserted into the openings 474.

In the illustrated embodiment, the housing 472 is shown as a single conductive body 473. However, it is to be appreciated that the housing 472 may comprise one or more discrete conductive components. The discrete components may be individually grounded, or the discrete components may be joined mechanically or by any form of metallic bonding, to form a single electrically conductive body 473.

Figure 4B:
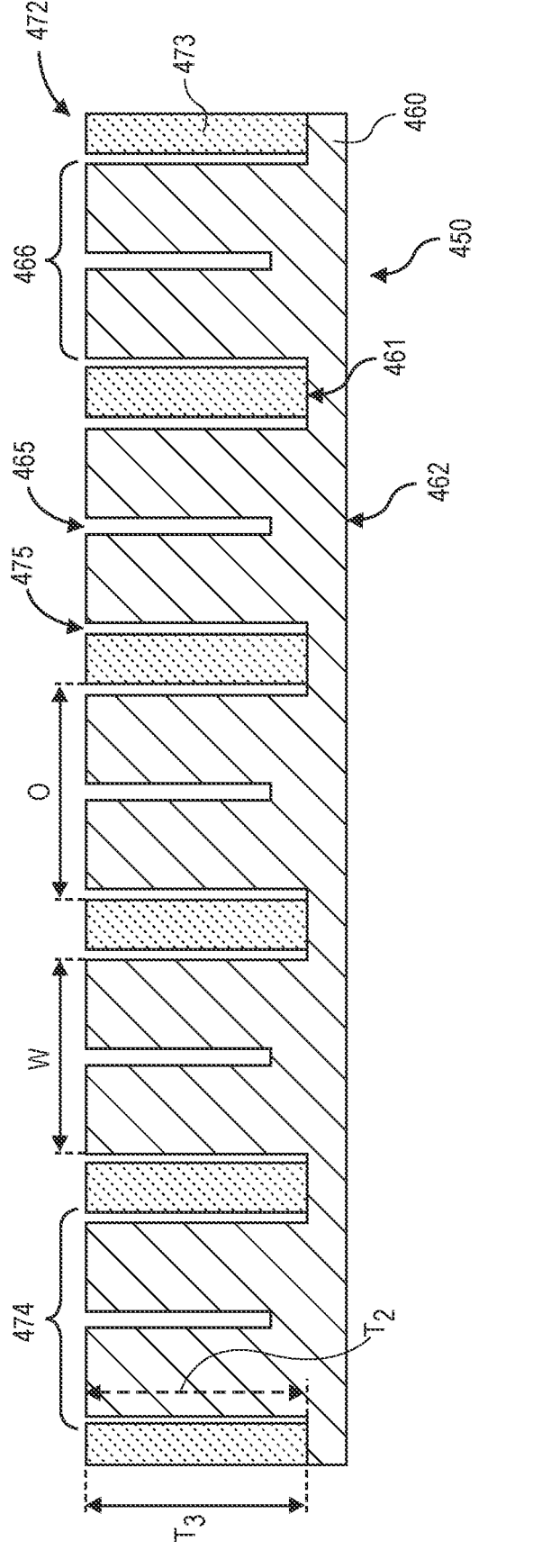
FIG. 4B is a cross-sectional illustration of assembly after the monolithic source array and the housing mated together, in accordance with an embodiment.

Referring now to FIG. 4B, a cross-sectional illustration of the assembly 470 is shown, in accordance with an embodiment. As shown, the conductive body 473 of the housing 472 is supported by the first surface 461 of the dielectric plate 460. In the illustrated embodiment, the conductive body 473 is directly supported by the first surface 461, but it is to be appreciated that a thermal interface material or the like may separate the conductive body 473 from the first surface 461. In an embodiment, the second surface 462 of the dielectric plate 460 faces away from the housing 472.

In an embodiment, the housing 472 has a third thickness $T_3$. The third thickness $T_3$ of the housing 472 may be similar to the second thickness $T_2$ of the protrusions 466. In other embodiments, the third thickness $T_3$ of the housing 472 may be larger or smaller than the second thickness $T_2$ of the protrusions 466.

In the illustrated embodiment, the openings 474 have an opening diameter O that is greater than the width W of the protrusions 466. The difference in the dimensions results in a gap 475 between sidewalls of the protrusions 466 and the sidewalls of the conductive body 473. The gap 475 may be suitable to allow for some degree of thermal expansion while still maintaining a secure fit between the monolithic source array 450 and the housing 472.

As will be shown in more detail below, different surfaces of the assembly 470 will be exposed to different environments. For example, the second surface 462 is configured to be exposed to a chamber volume. The opposite side of the assembly 470 is configured to be exposed to the atmosphere or other environments with pressures higher than that of the chamber volume during operation (e.g., approximately 1.0 atm or higher). Accordingly, the small gaps 475 between the conductive body 473 and the protrusions 466 will not experience a low pressure environment suitable for igniting a plasma.

Figure 4C:
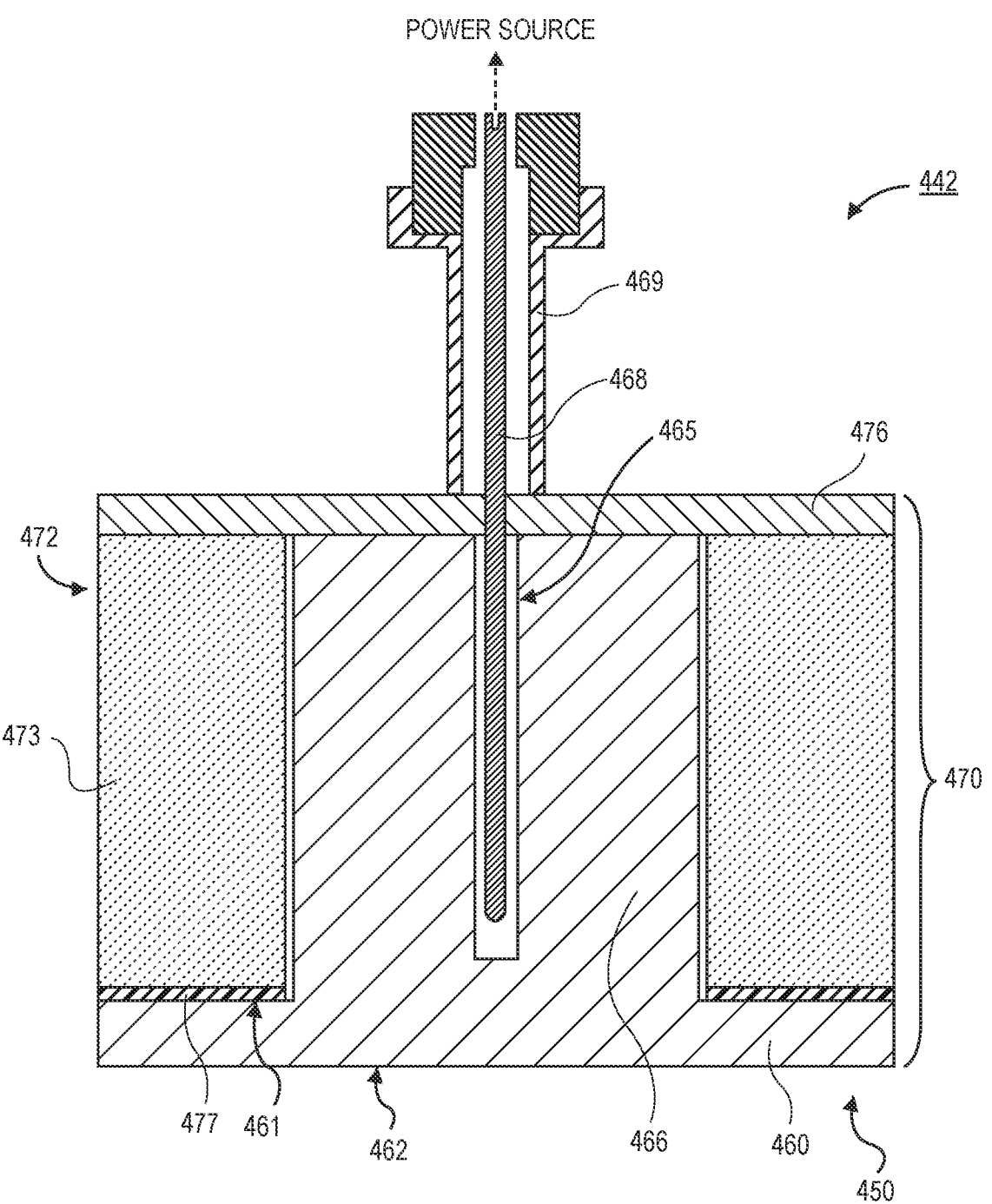
FIG. 4C is a cross-sectional illustration of an applicator that comprises components from the assembly, in accordance with an embodiment.

Referring now to FIG. 4C, a cross-sectional illustration of an applicator 442 that is integrated with the assembly 470 is shown, in accordance with an embodiment. In an embodiment, the applicator 442 comprises the protrusion 466, the conductive body 473 surrounding the protrusion 466, and the monopole antenna 468 extending into the hole 465. In an embodiment, a conductive plate 476 may also cover a top surface of the protrusion 466. Accordingly, portions of the assembly 470 may be used as components of the applicator 442. For example, the protrusion 466 is part of the monolithic source array 450 and functions as the dielectric cavity resonator of the applicator 442, and the conductive body 473 is part of the housing 472 and functions as the ground plane surrounding dielectric cavity resonator for the applicator 442.

The monopole antenna 468 may be surrounded by shielding 469 above the assembly 470, and the monopole antenna 468 may be electrically coupled to a high-frequency power source (e.g., a high-frequency emission module 105 or the like). The monopole antenna 468 passes through conductive plate 476 and extends into the hole 465. In some embodiments, the hole 465 extends deeper into the protrusion 466 than the monopole antenna 468. Additionally, the width of the hole 465 may be greater than the width of the monopole antenna 468. Accordingly, tolerances for thermal expansion are provided in some embodiments in order to prevent damage to the monolithic source array 450. Also shown in FIG. 4C is a thermal interface material 477 between a bottom surface of the conductive body 473 and the first surface 461 of the dielectric plate 460. A thermal interface material 477 may improve heat transfer between the conductive body 473 and the dielectric plate 460 when active heating or cooling is implemented in the assembly 470. In other embodiments, the thermal interface material 477 may be a bonding layer, or a thermal interface material 477 and a bonding layer.

Figure 5:
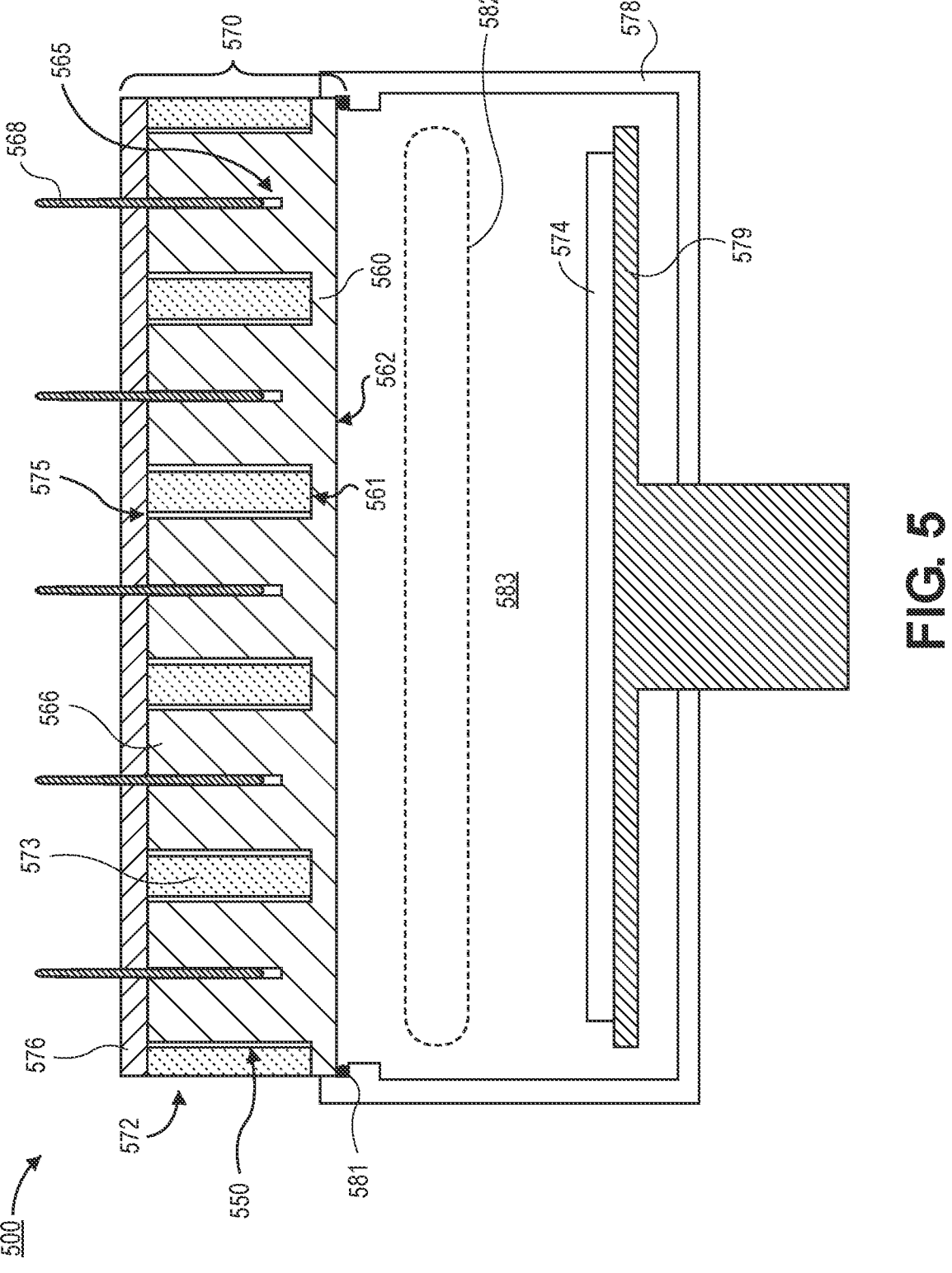
FIG. 5 is a cross-sectional illustration of a processing tool that comprises an assembly that includes a monolithic source array and a housing, in accordance with an embodiment.

Referring now to FIG. 5, a cross-sectional illustration of a processing tool 500 that includes an assembly 570 is shown, in accordance with an embodiment. In an embodiment, the processing tool comprises a chamber 578 that is sealed by an assembly 570. For example, the assembly 570 may rest against one or more o-rings 581 to provide a vacuum seal to an interior volume 583 of the chamber 578. In other embodiments, the assembly 570 may interface with the chamber 578. That is, the assembly 570 may be part of a lid that seals the chamber 578. In an embodiment, the processing tool 500 may comprise a plurality of processing volumes (which may be fluidically coupled together), with each processing volume having a different assembly 570. In an embodiment, a chuck 579 or the like may support a workpiece 574 (e.g., wafer, substrate, etc.).

In an embodiment, the assembly 570 may be substantially similar to the assemblies 470 described above. For example, the assembly 570 comprises a monolithic source array 550 and a housing 572. The monolithic source array 550 may comprise a dielectric plate 560 and a plurality of protrusions 566 extending up from a first surface 561 of the dielectric plate 560. A second surface 562 of the dielectric plate 560 may be exposed to the interior volume 583 of the chamber 578. The housing 572 may having openings sized to receive the protrusions 566. In some embodiments gaps 575 may be provided between the protrusions 566 and the conductive body 573 of the housing 572 to allow for thermal expansion. In an embodiment, monopole antennas 568 may extend into holes 565 in the protrusions 566. The monopole antennas 568 may pass through a top plate 576 over the housing 572 and the protrusions 566.

In an embodiment, the chamber volume 583 may be suitable for striking a plasma 582. That is, the chamber volume 583 may be a vacuum chamber. In an embodiment, only the second surface 562 is exposed to the chamber volume 583 (if it is not covered by a dielectric layer, such as those described above). The opposite surfaces are outside of the chamber volume 583 and, therefore, do not experience the low pressure conditions needed to strike a plasma 582. Accordingly, even when there are high electric fields in the gaps 575 between the sidewalls of the protrusions 566 and the conductive body 573, there is no plasma generated.

Figure 6:
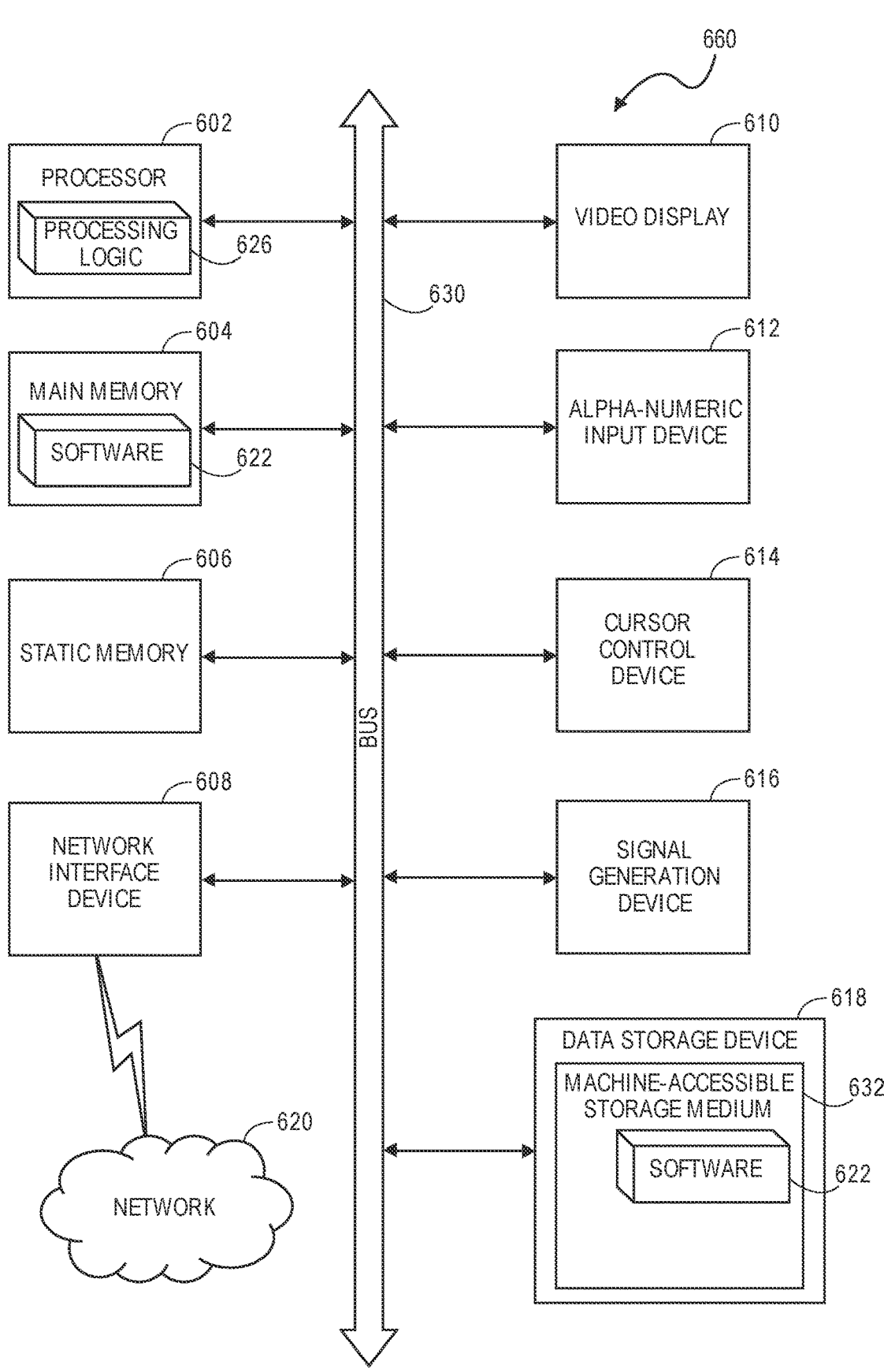
FIG. 6 illustrates a block diagram of an exemplary computer system that may be used in conjunction with a high-frequency plasma tool, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 632 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608. In an embodiment, the network interface device 608 may operate using RF coupling, optical coupling, acoustic coupling, or inductive coupling.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A monolithic source array, comprising:
a dielectric plate having a first surface and a second surface opposite from the first surface;
a plurality of protrusions that extend out from the first surface of the dielectric plate, wherein the plurality of protrusions and the dielectric plate are a monolithic structure, wherein a cross-section of each protrusion along a plane parallel to the first surface is circular and has a same area, and wherein each protrusion has a hole extending partially through a center of the protrusion; and
a conductive layer conformal with the plurality of protrusions, wherein the conductive layer has a plurality of openings therein, and wherein each of the plurality of openings in the conductive layer exposes a corresponding one of the holes in the plurality of protrusions.

2. The monolithic source array of claim 1, wherein each protrusion comprises a sidewall surface and a third surface, wherein the third surface is parallel to the first surface.

3. The monolithic source array of claim 2, wherein a depth of the hole is less than a thickness of the protrusions between the third surface and the first surface.

4. The monolithic source array of claim 1, wherein each protrusion of the plurality of protrusions is centrally symmetric about an axis perpendicular to the first surface.

5. The monolithic source array of claim 1, wherein the dielectric plate has a thickness between the first surface and the second surface that is approximately 30 mm or less.

6. The monolithic source array of claim 5, wherein the thickness between the first surface and the second surface is approximately 10 mm or less.

7. The monolithic source array of claim 1, wherein the dielectric plate comprises an inert dielectric layer over the second surface.

8. The monolithic source array of claim 7, wherein the inert dielectric layer comprises one or more of AlN, SiN, $SiO_2$, $Al_2O_3$, a transition metal nitride, a transition metal oxide, a composition comprising Al, O, and N, a composition comprising Al, Hf, O, and F, a composition comprising Y, O, F, and N, and a composition comprising Hf, Zr, O, F, and N.

9. The monolithic source array of claim 1, wherein the dielectric plate and the protrusions comprise $Al_2O_3$.

\* \* \* \* \*